(12) United States Patent
Yoshioka et al.

(10) Patent No.: US 10,775,411 B2
(45) Date of Patent: Sep. 15, 2020

(54) PROBE CARD AND CONTACT INSPECTION DEVICE

(71) Applicant: Kabushiki Kaisha Nihon Micronics, Musashino-shi (JP)

(72) Inventors: Tetsuya Yoshioka, Musashino (JP); Takashi Kawano, Musashino (JP); Shigeki Makise, Musashino (JP); Mika Nasu, Musashino (JP)

(73) Assignee: Kabushiki Kaisha Nihon Micronics, Musashino-shi (JP)

( * ) Notice: Subject to any disclaimer, the term of this patent is extended or adjusted under 35 U.S.C. 154(b) by 231 days.

(21) Appl. No.: 15/770,062

(22) PCT Filed: Oct. 13, 2016

(86) PCT No.: PCT/JP2016/080301
§ 371 (c)(1),
(2) Date: Apr. 20, 2018

(87) PCT Pub. No.: WO2017/069028
PCT Pub. Date: Apr. 27, 2017

(65) Prior Publication Data
US 2018/0299489 A1    Oct. 18, 2018

(30) Foreign Application Priority Data
Oct. 21, 2015   (JP) ................. 2015-207263

(51) Int. Cl.
*G01R 1/073* (2006.01)
*G01R 1/067* (2006.01)
*G01R 31/28* (2006.01)

(52) U.S. Cl.
CPC ..... *G01R 1/07314* (2013.01); *G01R 1/06705* (2013.01); *G01R 1/07328* (2013.01);
(Continued)

(58) Field of Classification Search
CPC ............ G01R 1/06705; G01R 1/06716; G01R 1/06733; G01R 1/07314; G01R 1/07328;
(Continued)

(56) References Cited

U.S. PATENT DOCUMENTS

2007/0001692 A1*  1/2007  Yamada ............. G01R 1/06722
                                                        324/750.09
2007/0269999 A1   11/2007  Di Stefano
(Continued)

FOREIGN PATENT DOCUMENTS

CN        101271145 A     9/2008
EP          2690447 A2    1/2014
(Continued)

OTHER PUBLICATIONS

International Preliminary Report on Patentability dated Apr. 24, 2018 for the corresponding PCT Patent Application No. PCT/JP2016/080301.
(Continued)

Primary Examiner — Tung X Nguyen
Assistant Examiner — Robert P Alejnikov, Jr.
(74) Attorney, Agent, or Firm — Leason Ellis LLP

(57) ABSTRACT

A probe card includes a probe having a spring property and a probe head that holds the probe. The probe head includes a guide portion that holds the probe such that the probe can move in an axis direction Z. The guide portion includes a heat radiation structure that absorbs heat of the probe generated by energization and emits the heat to the outside of the probe.

12 Claims, 9 Drawing Sheets

(52) U.S. Cl.
CPC ...... *G01R 1/07371* (2013.01); *G01R 1/06722* (2013.01); *G01R 1/06777* (2013.01); *G01R 31/2887* (2013.01)

(58) Field of Classification Search
CPC ............ G01R 1/07371; G01R 31/2886; G01R 1/07307; G01R 1/07342; G01R 1/067; G01R 1/06722; G01R 1/0416; G01R 1/07378; G01R 31/041; G01R 31/2808
USPC .......................... 324/756.03, 755.05, 756.05
See application file for complete search history.

(56) References Cited

U.S. PATENT DOCUMENTS

| | | | |
|---|---|---|---|
| 2009/0239394 A1* | 9/2009 | Yamada | G01R 1/045 439/55 |
| 2013/0009658 A1 | 1/2013 | Nishikawa | |
| 2013/0093446 A1* | 4/2013 | Mochizuki | G01R 1/0491 324/750.08 |
| 2014/0062517 A1* | 3/2014 | Harada | H04N 17/002 324/754.03 |
| 2014/0266275 A1* | 9/2014 | Kimura | G01R 1/07357 324/750.25 |
| 2015/0276806 A1 | 10/2015 | Wu et al. | |
| 2015/0276807 A1* | 10/2015 | Chen | G01R 1/06722 324/755.05 |
| 2015/0301083 A1 | 10/2015 | Kimura et al. | |

FOREIGN PATENT DOCUMENTS

| | | | | |
|---|---|---|---|---|
| EP | 2765427 | A1 | 8/2014 | |
| JP | 06-163657 | A | 6/1994 | |
| JP | 2003-215163 | A | 7/2003 | |
| JP | 2006-3191 | A | 1/2006 | |
| JP | 2007-12475 | A | 1/2007 | |
| JP | 2009-162483 | A | 7/2009 | |
| JP | 2009-230897 | A | 10/2009 | |
| JP | 2014-44099 | A | 3/2014 | |
| JP | 2014-181910 | A | 9/2014 | |
| JP | 2015-148561 | A | 8/2015 | |
| KR | 10-2012-0000503 | A | 1/2012 | |
| KR | 10-2014-0065467 | A | 5/2014 | |
| KR | 10-2015-0037939 | A | 4/2015 | |
| TW | 201217790 | A1 | 5/2012 | |
| TW | 201331587 | A | 8/2013 | |
| TW | 201411133 | A | 3/2014 | |
| WO | WO-2011/115082 | A | 9/2011 | |
| WO | WO-2011115082 | A1 * | 9/2011 | ......... G01R 1/06738 |
| WO | WO-2013/051099 | A | 4/2013 | |
| WO | WO-2013/051675 | A | 4/2013 | |
| WO | WO-2014/021194 | A | 2/2014 | |

OTHER PUBLICATIONS

Taiwanese Office Action dated Oct. 18, 2017 for the corresponding Taiwanese Patent Application No. 105133572.
Korean Office Action dated Feb. 26, 2019 for the corresponding Korean Patent Application No. 10-2018-7011736.
Extended European Search Report dated May 17, 2019 for the corresponding European Patent Application No. 16857343.4.
Japanese Office Action dated Aug. 29, 2019 for the corresponding Japanese Patent Application No. 2015-207263.
International Search Report dated Dec. 13, 2016 for the corresponding PCT International Application No. PCT/JP2016/080301.
Chinese Office Action dated Nov. 1, 2019 for the corresponding Chinese Patent Application No. 201680061723.X.

* cited by examiner

PROBE CARD AND CONTACT INSPECTION DEVICE

CROSS-REFERENCE TO RELATED PATENT APPLICATIONS

This application is a U.S. National Phase Application under 35 U.S.C. § 371 of International Patent Application No. PCT/JP2016/080301, filed Oct. 13, 2016, and claims the benefit of Japanese Patent Application No. 2015-207263, filed on Oct. 21, 2015, all of which are incorporated by reference in their entirety herein. The International Application was published in Japanese on Apr. 27, 2017 as International Publication No. WO/2017/069028 under PCT Article 21(2).

FIELD OF THE INVENTION

The present invention relates to a probe card used for an energization test or the like of a semiconductor integrated circuit and a contact inspection device that includes the probe card.

BACKGROUND OF THE INVENTION

A contact inspection device establishes an electrical connection state by pressing a conductive probe having a spring property with appropriate pressing force using the spring property while the probe contacts an inspected portion of an inspected object. A device that passes a current and performs an inspection in this state is a contact inspection device. Examples of prior arts of this kind of the contact inspection device include devices described in JP 2009-162483 A, JP 2006-3191 A, JP 2014-44099 A and JP 2015-148561 A.

FIG. 9 illustrates a structure of a conventional probe head 100. The probe head 100 basically includes seven parts in total of a probe 101, a lower plate 102, an intermediate spacer 103, an upper plate 104, a first intermediate guide film 105, a second intermediate guide film 106, and a third intermediate guide film 107. Straightness of the probe 101 is kept by holding the probe 101 with the five members of the lower plate 102, the upper plate 104, the first intermediate guide film 105, the second intermediate guide film 106, and the third intermediate guide film 107.

A range held by the first intermediate guide film 105, the second intermediate guide film 106, and the third intermediate guide film 107 is set to a narrow range except for portions 108 in which spring action of the probe 101 appears.

Problem to be Solved by the Invention

A case in which a high current is applied to such a contact inspection device during an energization inspection has been increasing. Upon application of a high current to the contact inspection device, Joule heat greatly occurs and a temperature of a probe rises. The spring property deteriorates with a rise in a temperature of a portion in which the abovementioned spring property of the probe appears. The deterioration of the spring property prevents the probe from pressing against an inspected portion of an inspected object with appropriate pressing force, so that inspection accuracy may be lowered.

However, a consideration has not been given to a risk of deterioration of spring property due to a rise in temperature of a probe by Joule heat generated when a high current is applied during an energization inspection, which is also not described at all in JP 2009-162483 A, JP 2006-3191 A, JP 2014-44099 A and JP 2015-148561 A.

The first intermediate guide film 105, the second intermediate guide film 106, and the third intermediate guide film 107 illustrated in FIG. 9 are provided for the purpose of maintaining straightness of the probe 101, thereby resulting in an extremely small effect of radiating heat that can be expected with a current configuration having a small contact area with the probe 101.

The purpose of the present invention is to reduce a risk of deterioration of a spring property of a conductive probe having the spring property even when a high current is applied during an energization inspection in a probe card that performs an energization inspection on an inspected object by using the probe and in a contact inspection device that includes the probe card.

SUMMARY OF THE INVENTION

Means for Solving the Problem

In order to solve the problems, a probe card according to a first aspect of the present invention is a probe card that includes a probe having a spring property and a probe head that holds the probe. The probe head includes a guide portion that holds the probe such that the probe can move in an axis direction. The guide portion includes a heat radiation structure that absorbs heat of the probe generated by energization and emits the heat to the outside of the probe.

According to this aspect, the guide portion includes the heat radiation structure that absorbs heat of the probe and emits the heat to the outside of the probe. As a result, even if Joule heat greatly occurs and a temperature of the probe rises upon application of a high current during an energization inspection, the heat radiation structure absorbs the Joule heat and radiates the heat to the outside. Therefore, a rise in temperature of the probe is suppressed, so that a risk of a decrease in the spring property of the probe can be reduced.

The probe card according to a second aspect of the present invention is the probe card according to the first aspect, wherein in the heat radiation structure, at least a part of a portion of the guide portion opposite to the probe is formed of a high heat conductive material that radiates and dissipates heat generated in the probe in a direction away from the probe.

Herein, specifically, examples of the high heat conductive material include fine ceramic-based, machinable ceramic-based, resin-based, and polyimide-based (which is not thin like a film and has a thickness) materials. One kind of the materials or a composite structure having a combination of a plurality of kinds thereof may be used.

Note that a material for the guide portion is preferably a material satisfying specifications required of electrical insulation, heat radiation, and heat resistance in addition to the heat conductivity and also a material having a low coefficient of linear expansion.

According to this aspect, in the heat radiation structure, at least a part of a portion of the guide portion opposite to the probe is formed of a high heat conductive material that radiates and dissipates heat generated in the probe in a direction away from the probe. This configuration allows the guide portion to guide movement of the probe during an energization inspection and allows the Joule heat to be easily absorbed and radiated by the guide portion formed of the high heat conductive material. As a result, a rise in temperature of the probe is suppressed, so that a risk of a decrease in the spring property of the probe can be reduced.

Also according to this aspect, the heat radiation structure can be simplified. It is needless to say that the heat radiation structure is not limited to a structure using the high heat conductive material.

The probe card according to a third aspect of the present invention is the probe card according to the first aspect or the second aspect, wherein at least a part of a heat-absorbing portion of the heat radiation structure is located opposite to a portion in which the spring property of the probe appears.

According to this aspect, at least a part of the heat-absorbing portion of the heat radiation structure is located opposite to the portion in which the spring property of the probe appears, and therefore the heat-absorbing portion absorbs directly Joule heat generated from the portion in which the spring property of the probe appears. Thus, a decrease in the spring property of the probe can be effectively suppressed.

The probe card according to a fourth aspect of the present invention is the probe card according to any one of the first to third aspects, wherein the probe head includes an upper guide portion having an upper guide hole for holding an upper portion of the probe, a lower guide portion having a lower guide hole for holding a lower portion of the probe, and an intermediate guide portion that is located between the upper guide portion and the lower guide portion and has an intermediate guide hole for holding an intermediate portion of the probe, and a guide portion including the heat radiation structure is the intermediate guide portion.

According to this aspect, the probe is guided by the plurality of guide portions including the upper guide portion, the lower guide portion, and the intermediate guide portion located therebetween. Thus, while guiding the probe during an energization inspection with high accuracy and suppressing a rise in temperature of the probe, a risk of a decrease in the spring property can be reduced.

The probe card according to a fifth aspect of the present invention is the probe card according to the fourth aspect, wherein the guide portion including the heat radiation structure is divided into a plurality of guide portions in a vertical direction.

According to this aspect, the intermediate guide portion (portion having the intermediate guide hole) including the heat radiation structure is divided into the plurality of guide portions in the vertical direction. This allows the probe to be easily assembled, thereby improving productivity of the probe card.

The probe card according to a sixth aspect of the present invention is the probe card according to any one of the first to fifth aspects, wherein the spring property of the probe is provided by a slit provided in a conductive tube body forming the probe.

In a case of a probe having a structure in which a spring property of the probe is provided by forming a spiral slit in a part of a conductive tube body forming the probe, there is a tendency that the spring property is lowered due to a rise in temperature particularly by Joule heat.

According to this aspect, a decrease in the spring property of the probe having such a structure due to a rise in temperature can be effectively suppressed.

The probe card according to a seventh aspect of the present invention is the probe card according to the sixth aspect, wherein the probe includes a tube body including a spring portion in which the spring property appears in a part of a guide tube portion having a sleeve-like shape, and a rod body that is inserted in the tube body, can be displaced in an axis direction together with the tube body by being bonded to a part of the guide tube portion, and has conductivity.

According to this aspect, in the probe card using the probe that includes the tube body having the spring property and the plunger that is inserted in the tube body and has conductivity, the same functional effect as that in an sixth aspect can be obtained. That is to say, a decrease in the spring property due to a rise in temperature of the probe can be effectively suppressed.

A contact inspection device according to an eighth aspect of the present invention is a contact inspection device that includes a mounting portion on which an inspected object is mounted, a probe card that includes a probe having a spring property, and a drive unit that changes a relative position between an inspected portion of an inspected object on the mounting portion and the probe card such that the inspected portion and the probe card can move close to and away from each other. The contact inspection device performs an energization inspection on the inspected portion of the inspected object mounted on the mounting portion while the probe contacts the inspected portion. The probe card is the probe card according to any one of the first to seventh aspects.

According to this aspect, by applying action and effects of any one of the first to seventh aspects of the probe to the contact inspection device, a decrease in the spring property due to a rise in temperature of the probe can be effectively suppressed, and inspection accuracy of the contact inspection device can be improved.

BRIEF DESCRIPTION OF THE DRAWINGS

These and other features and advantages of the present invention will become more readily appreciated when considered in connection with the following detailed description and appended drawings, wherein like designations denote like elements in the various views, and wherein.

DETAILED DESCRIPTION OF THE INVENTION

A probe card and a contact inspection device according to an embodiment of the present invention are described below in detail with reference to the accompanying drawings.

Note that, in the following description, an outline of the contact inspection device according to the embodiment of the present invention is described first based on FIG. 1 and FIG. 3. Next, a specific configuration of the probe card according to the embodiment of the present invention is described based on FIG. 2 and FIGS. 4 to 6. Furthermore, a content of an energization inspection performed by using the probe card is described with focus on operations during non-energization and energization of a probe based on FIG. 7A and FIG. 8.

Figure 1:
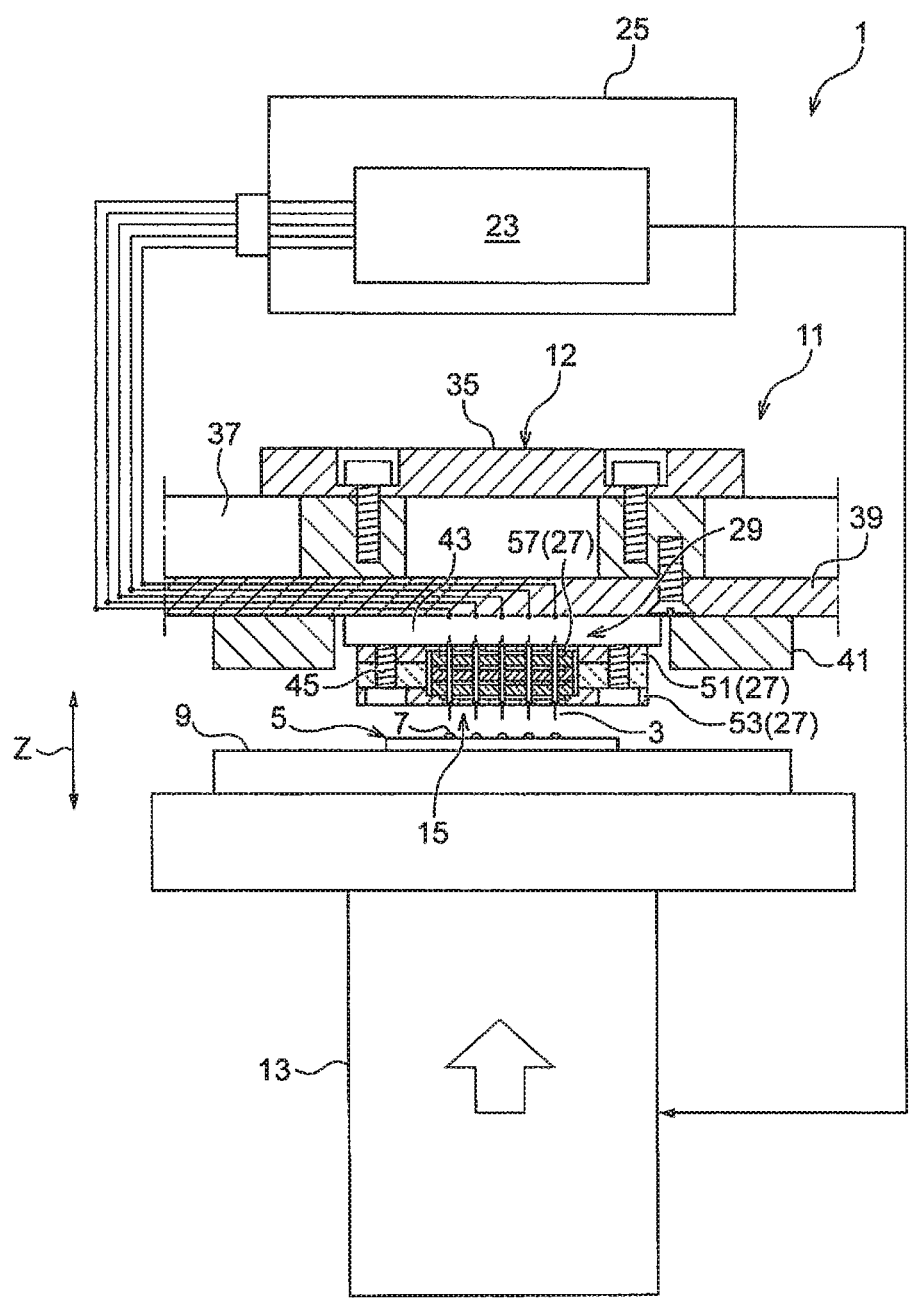
FIG. 1 is a sectional side view schematically illustrating a contact inspection device according to an embodiment of the present invention.
Figure 3:
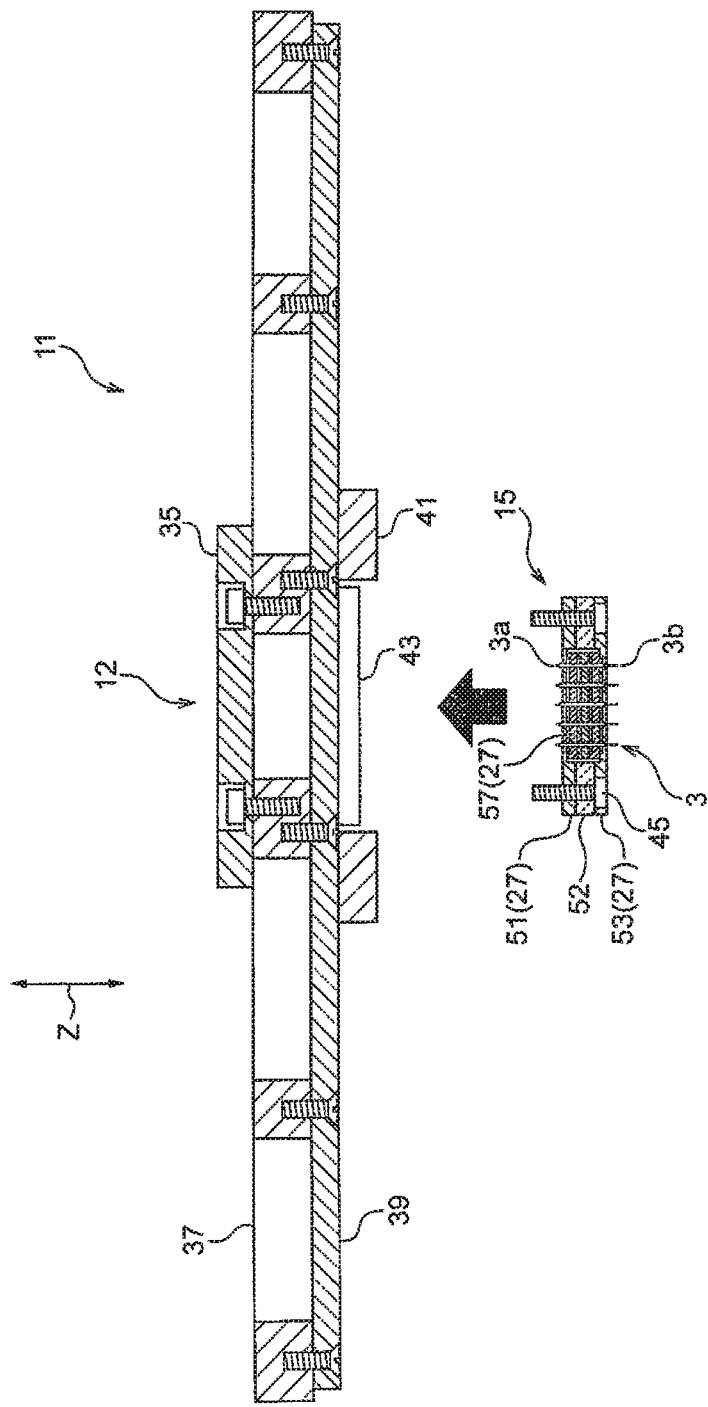
FIG. 3 is a sectional side view schematically illustrating a card structure of the probe card according to the embodiment of the present invention.
Figure 4:
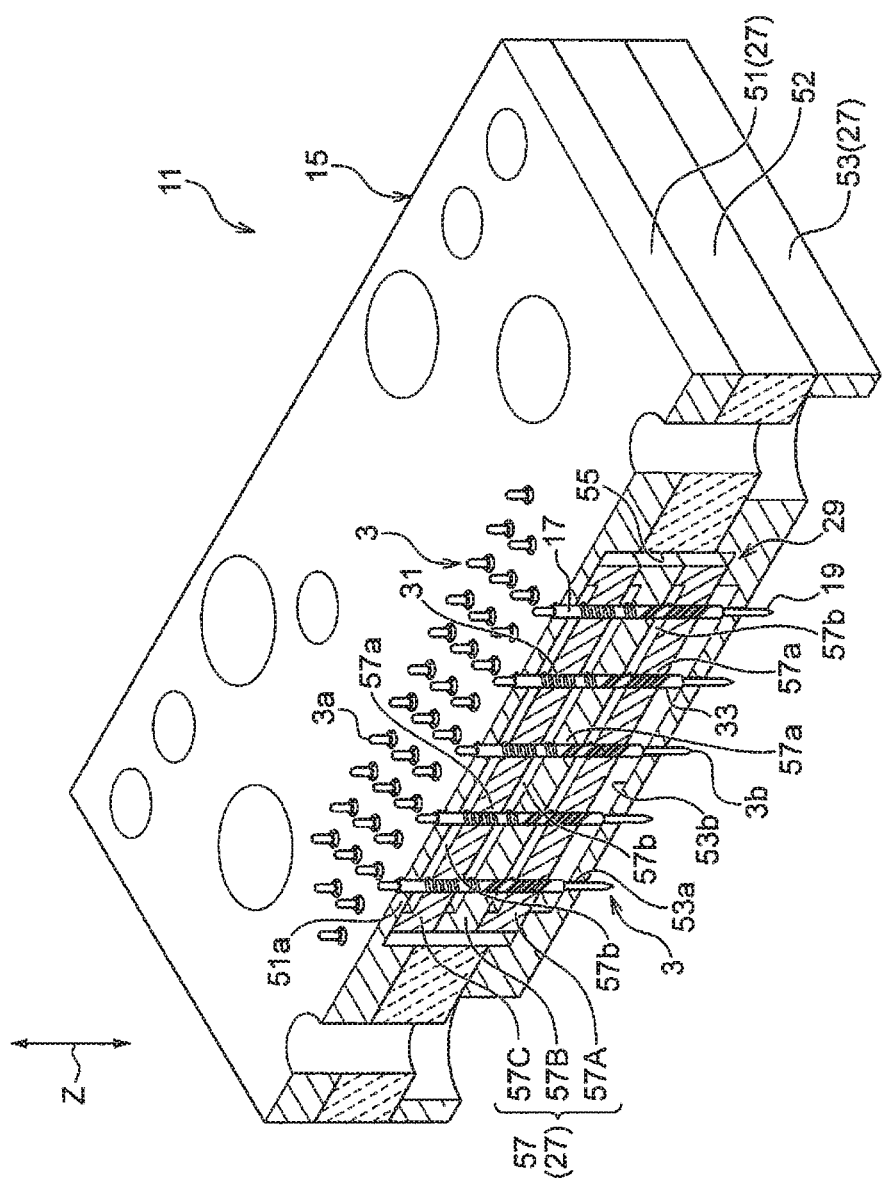
FIG. 4 is a perspective view schematically illustrating the probe card according to the embodiment of the present invention.

(1) Outline of Contact Inspection Device (See FIGS. 1 and 3)

A contact inspection device 1 establishes an electrical connection state by pressing a conductive probe 3 having a spring property with appropriate pressing force using the spring property while the probe 3 contacts an inspected portion 7 of an inspected object 5. The contact inspection device 1 is used for the purpose of measuring electrical characteristics such as a current value and a voltage difference of the inspected portion 7 by energizing the probe 3 in the state above and performing an operation test of the entire inspected object 5 to determine the quality of the inspected object 5.

Examples of the inspected object 5 being an inspected target of the contact inspection device 1 include an electronic substrate such as a printed wiring board, a semiconductor wafer, and a semiconductor chip such as a packaged IC and an LSI. It is assumed that the inspected portion 7 in direct contact with the probe 3 is an inspection pattern or an electrode on an electronic circuit mounted on an electronic substrate or the like. A surface of the inspected portion 7 being the electrode or the like is usually covered with an oxide film during an inspection.

Specifically, the contact inspection device 1 basically includes a mounting portion 9 on which the inspected object 5 described above is mounted, a probe card 11 of the present invention including the probe 3 having the spring property, and a drive unit 13 that changes a relative position between the inspected portion 7 of the inspected object 5 on the mounting portion 9 and the probe card 11 such that the inspected portion 7 and the probe card 11 can move close to and away from each other.

The probe card 11 includes a plurality of the probes 3 having the spring property and a probe head 15 that holds the plurality of probes 3. The probe 3 includes a tube body 17 (FIG. 2) having a cylindrical sleeve-like shape as an example of a long tube body and a plunger (rod body) 19 having a round rod-like shape as an example of a long plunger inserted in the tube body 17.

In the illustrated embodiment, the probe head 15 described above is formed so as to be directly attached to a card structure 12 as illustrated in FIG. 3. Specifically, the probe head 15 is formed so as to be attached, by being inserted from below and tightening a fix screw 45, to a multi level cell (MLC) 43, as an example, attached to a lower surface of a printed board 39 supported by a clamp head 35 and a stiffener 37 by using a fix ring 41.

The printed board 39 includes an electronic substrate having a multilayer structure in which a ceramic substrate and a wiring substrate are laminated as an example. The printed board 39 is connected to an output end of the MLC 43 having an input end connected to a base end portion 3a of the probe 3. Another end of the wiring path is connected to a tester 25 including a controller 23. The controller 23 measures electrical characteristics of the inspected portion 7 described above on the basis of data acquired by performing an energization inspection while a tip portion 3b of the probe 3 contacts the inspected portion 7, and performs an operation test of the entire inspected object 5 to determine the quality of the inspected object 5.

(2) Specific Configuration of Probe Card (See FIGS. 2 and 4 to 6)

The probe card 11 includes the probe 3 having the spring property as described above and the probe head 15 that holds the probe 3. The probe head 15 is provided with a guide portion 27 holding the probe 3 such that the probe 3 can move in an axis direction Z which is a pressing direction. The guide portion 27 includes a heat radiation structure 29 that absorbs heat of the probe 3 generated by energization and emits the heat to the outside of the probe 3.

Figure 5:
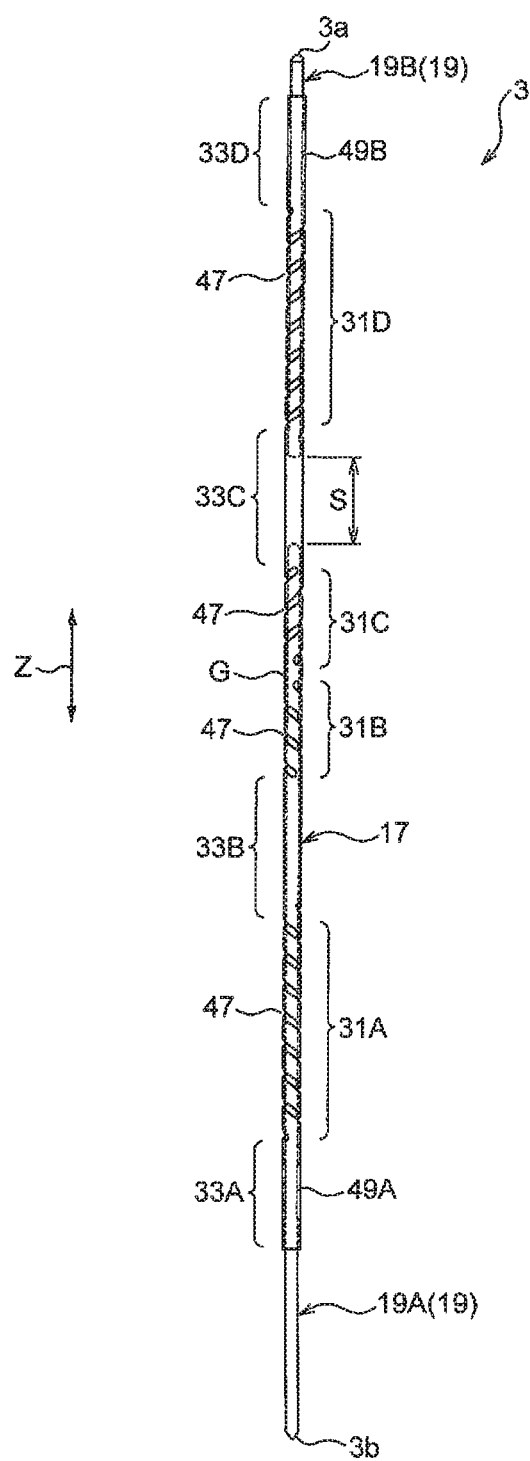
FIG. 5 is a side view illustrating a probe of the probe card according to the embodiment of the present invention.
Figure 6:
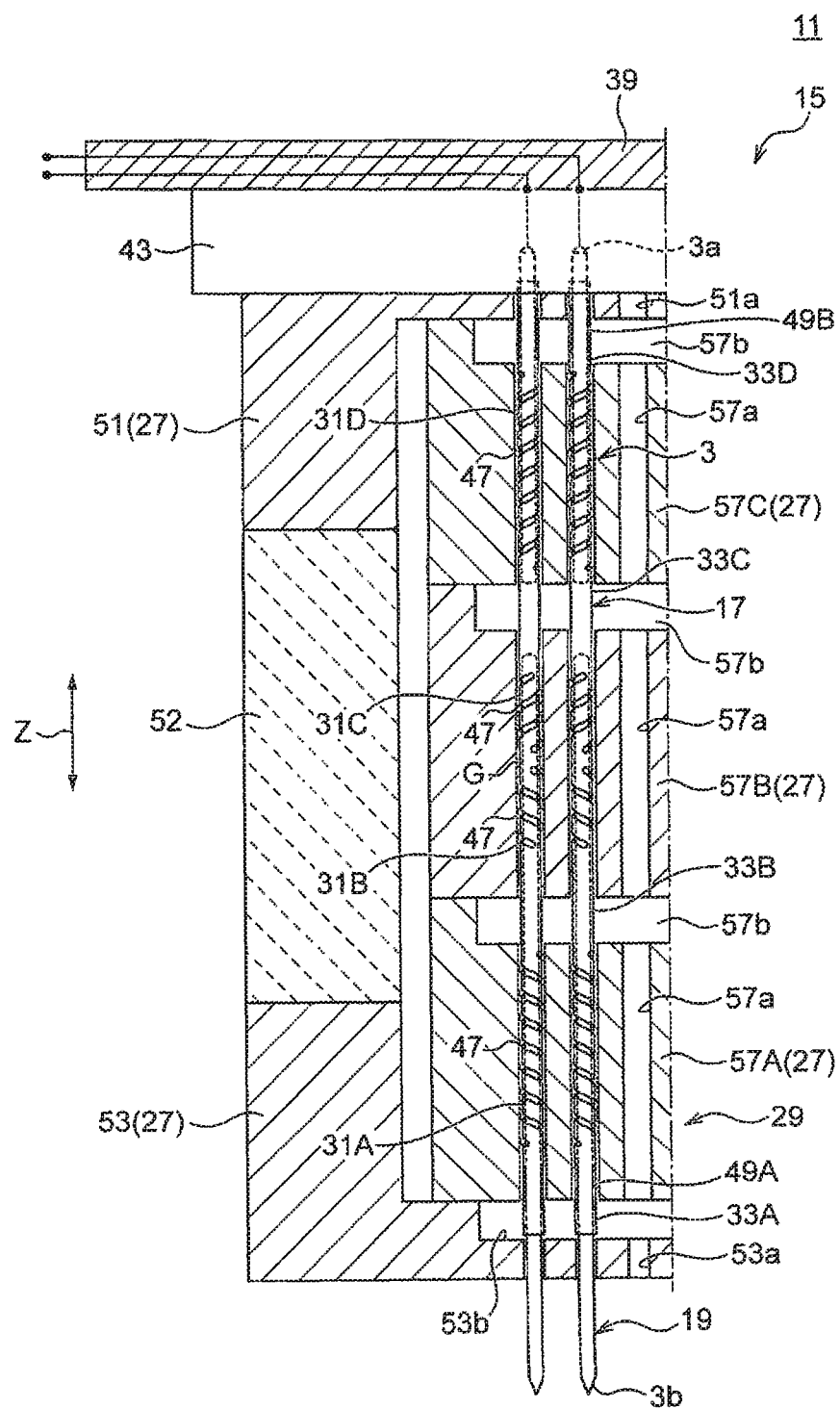
FIG. 6 is a sectional side view illustrating an enlarged main portion of the probe card according to the embodiment of the present invention.

(A) Specific Configuration of Probe (See FIG. 5)

Figure 2:
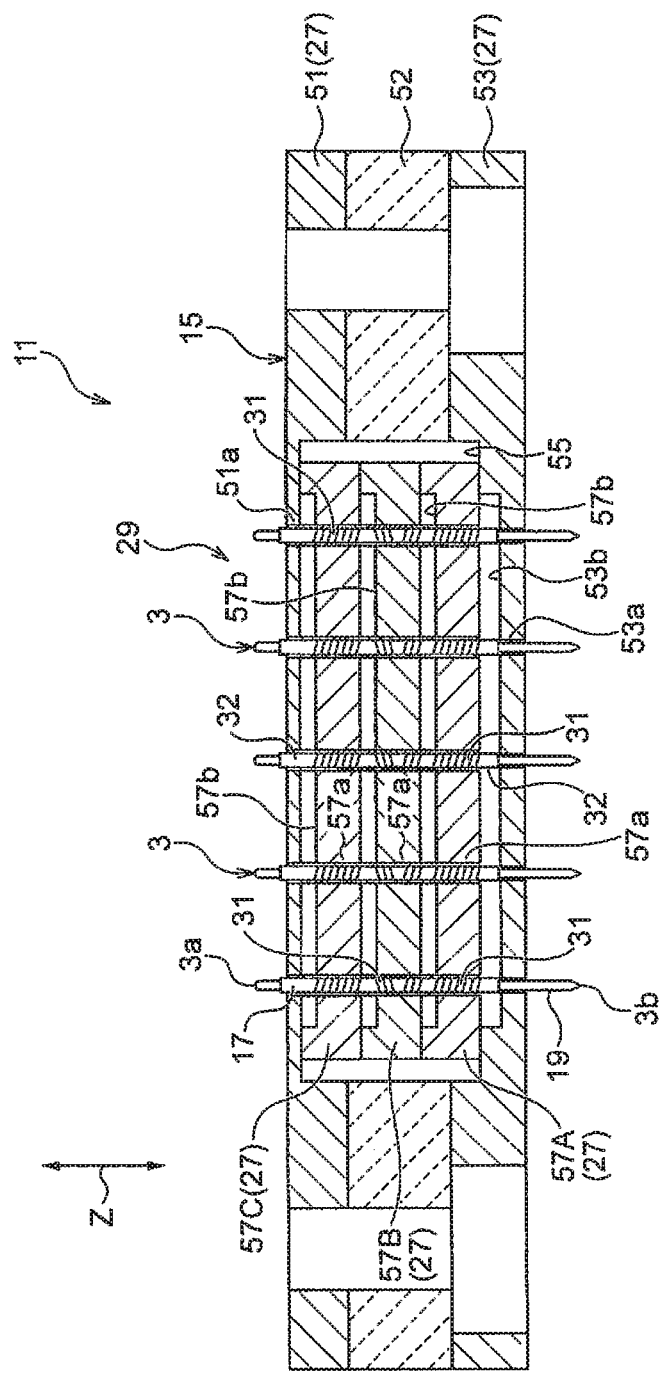
FIG. 2 is a sectional side view schematically illustrating a probe card according to the embodiment of the present invention.

As illustrated in FIG. 2, the probe 3 includes the tube body 17 including a spring portion 31 (31A, 31B, 31C, 31D) that causes a spring property to appear in a part of a guide tube portion 33 having a sleeve-like shape, and the plunger (rod body) 19 that is inserted in the tube body 17, can be displaced in the axis direction Z together with the tube body 17 by being bonded to a part of the guide tube portion 33, and has conductivity.

Also in the present embodiment, the spring property of the probe 3 is provided by the spring portion 31 (31A, 31B, 31C, 31D) formed with a slit 47 having a spiral shape provided in the tube body 17 having conductivity.

The tube body 17 is formed of an extremely thin tube member made of an alloy of nickel such as NiCo and NiP, as an example, having an outer diameter of less than or equal to 0.1 mm and a length of about 6 mm. The tube body 17 is provided with guide tube portions 33A, 33B, 33C, 33D having a cylindrical sleeve-like shape at four places at both ends and between the ends in the axis direction Z. The spring portion 31 that provides the spring property to the probe 3 is provided at three places between the guide tube portions 33A, 33B, 33C, 33D located at the four places.

Note that the spring portion 31 provided at the three places is formed such that, as an example, the two spring portions 31A, 31D respectively provided closer to the tip portion 3b and the base end portion 3a are long and the two spring portions 31B, 31C provided at the center of the spring portion 31 with a gap G therebetween are short. A winding direction of the spring portions 31A, 31B disposed on the tip portion 3b side and a winding direction of the spring portions 31C, 31D disposed on the base end portion 3a side are reversed at the gap G as a boundary. This resolves a twist of the tube body 17 when the tube body 17 presses the probe 3.

Furthermore, a bonding slit 49A and a bonding slit 49B that are straight, extend in the axis direction Z, have a predetermined length, and are located opposite to each other are respectively formed in the guide tube portion 33A located close to the tip portion 3b and the guide tube portion 33D located close to the base end portion 3a. By the way, the bonding slits 49A, 49B are formed for the purpose of preventing deformation of the tube body 17 when the plunger 19 and the tube body 17 are bonded together by resistance welding, caulking, or the like and maintaining a fixed outer diameter of the tube body 17.

The slit 47 having the spiral shape for providing the spring portion 31 can be formed by performing laser processing and etching separately or in combination.

The plunger 19 is a round rod-like member having a diameter of about 0.05 mm. In the present embodiment, two plungers of a first plunger 19A having a length of about 4 mm provided on the tip portion 3b side and a second plunger 19B having a length of about 2 mm provided on the base end portion 3a side are used for the plunger 19.

Of the first plunger 19A and the second plunger 19B, the first plunger 19A is made of an alloy of palladium such as AgPdCu, as an example, and has a tip of about 1 mm protruding from an end face on the tip portion 3b side of the tube body 17 while the first plunger 19A is installed in the tube body 17. On the other hand, a rear end of the first plunger 19A is formed so as to have a length that can reach the inside of the guide tube portion 33C.

The first plunger 19A is bonded to the tube body 17 at the place of the bonding slit 49A formed in the guide tube portion 33A described above and can move integrally with the tube body 17 in the axis direction Z.

The tip of the first plunger 19A is the tip portion 3b of the probe 3 and contacts the inspected portion 7 of the inspected object 5 described above during an energization inspection.

In contrast, the second plunger 19B is made of an alloy of palladium such as tungsten, rhodium (Rh), and AgPdCu, as an example, and has a rear end of about 0.2 mm protruding from an end face on the base end portion 3a side of the tube body 17 while the second plunger 19B is installed in the tube body 17. On the other hand, a tip of the second plunger 19B is formed so as to have a length that can reach the inside of the guide tube portion 33C.

The second plunger 19B is bonded to the tube body 17 at the place of the bonding slit 49B formed in the guide tube portion 33D described above and can move integrally with the tube body 17 in the axis direction Z.

A space S of approximately 0.4 mm is formed between the rear end of the first plunger 19A located in the guide tube portion 33C and the tip of the second plunger 19B located therein. The space S is formed such that a movement stroke of 0.4 mm in total by combining the first plunger 19A and the second plunger 19B can be obtained.

The rear end of the second plunger 19B is the base end portion 3a of the probe 3 and abuts a contact on the input side of the MLC 43 of the card structure 12 described above. By the contact, it is possible to output electrical characteristics of the inspected portion 7 described above during an energization inspection.

(B) Specific Configuration of Probe Head (See FIGS. 2 and 4 to 6)

In the present embodiment, the probe head 15 includes a plurality of probes 3, an upper guide portion 51 having an upper guide hole 51a for holding an upper portion of the probe 3 close to the base end portion 3a, a lower guide portion 53 having a lower guide hole 53a for holding a lower portion of the probe 3 close to the tip portion 3b, an intermediate spacer 52 disposed between the upper guide portion 51 and the lower guide portion 53, and an intermediate guide portion 57 that is located between the upper guide portion 51 and the lower guide portion 53, is housed in a housing recessed portion 55 formed in the upper guide portion 51, the intermediate spacer 52, and the lower guide portion 53, and has an intermediate guide hole 57a.

In the present embodiment, the intermediate guide portion 57 includes three intermediate guide portions of a first intermediate guide portion 57A located on the tip portion 3b side of the probe 3, a third intermediate guide portion 57C located on the base end portion 3a of the probe 3, and a second intermediate guide portion 57B located between the first intermediate guide portion 57A and the third intermediate guide portion 57C.

A recessed portion 57b having a predetermined depth is formed in an installment range of the probe 3 in an upper surface of each of the three intermediate guide portions 57A, 57B, 57C. A recessed portion 53b having a predetermined depth from an installment range of the probe 3 in a bottom surface of the housing recessed portion 55 described above is also formed in the lower guide portion 53 located at a bottom portion of the housing recessed portion 55.

After the probe 3 described above is inserted in the upper guide hole 51a formed in the upper guide portion 51, the probe 3 then passes through the three recessed portions 57b and the plurality of intermediate guide holes 57a formed in the three intermediate guide portions 57A, 57B, 57C, reaches the recessed portion 53b and the lower guide hole 53a of the lower guide portion 53, and is maintained at a predetermined position where a predetermined length of the tip portion 3b of the probe 3 protrudes from the lower surface of the probe head 15.

Furthermore, in the present embodiment, all the three intermediate guide portions 57A, 57B, 57C described above have the heat radiation structure 29. As a means for providing the heat radiation structure 29, the three intermediate guide portions 57A, 57B, 57C disposed opposite to each other so as to surround the four spring portions 31A, 31B, 31C, 31D of the tube body 17 described above are formed of a high heat conductive material having a higher degree of heat conductivity than that of the probe 3.

In the present embodiment, ceramic is adopted as a material for the intermediate guide portions 57A, 57B, 57C. Aluminum nitride-based fine ceramic having a high degree of heat conductivity in particular among ceramic can be used as a suitable material as an example. Fine ceramic-based, machinable ceramic-based, resin-based, and polyimide-based (which is not thin like a film and has a thickness) materials can be used as a material for the intermediate guide portions 57A, 57B, 57C. One kind of the materials or a composite structure having a combination of a plurality of kinds thereof may be used.

Note that a material for the intermediate guide portions 57A, 57B, 57C is preferably a material satisfying specifications required of electrical insulation, heat radiation, and heat resistance in addition to the heat conductivity and also a material having a low coefficient of linear expansion.

The heat radiation structure 29 may be formed by providing an aeration structure, a water-cooled structure, a Peltier structure, or the like in the probe head 15, other than by forming the intermediate guide portion 57 with a high heat conductive material.

In addition, in the present embodiment, as an example of a high heat conductive material having a high degree of heat conductivity than that of the probe 3, ceramic is used as a material for the lower guide portion 53 that maintains the portion close to the tip portion 3b of the probe 3 and the upper guide portion 51 that maintains the portion close to the base end portion 3a of the probe 3. Alloy 42 is used as an example of a material for the intermediate spacer 52.

Figure 7:
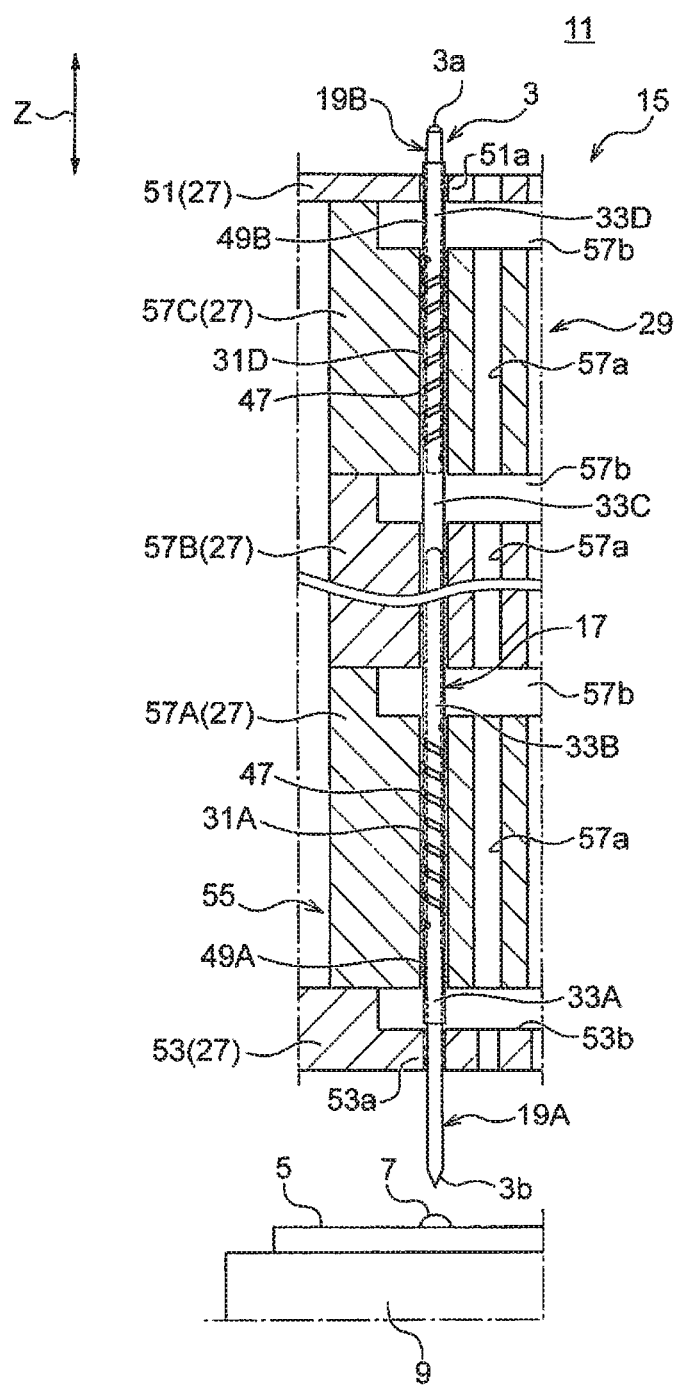
FIG. 7 is a sectional side view in a non-energization state of the probe card according to the embodiment of the present invention.
Figure 8:
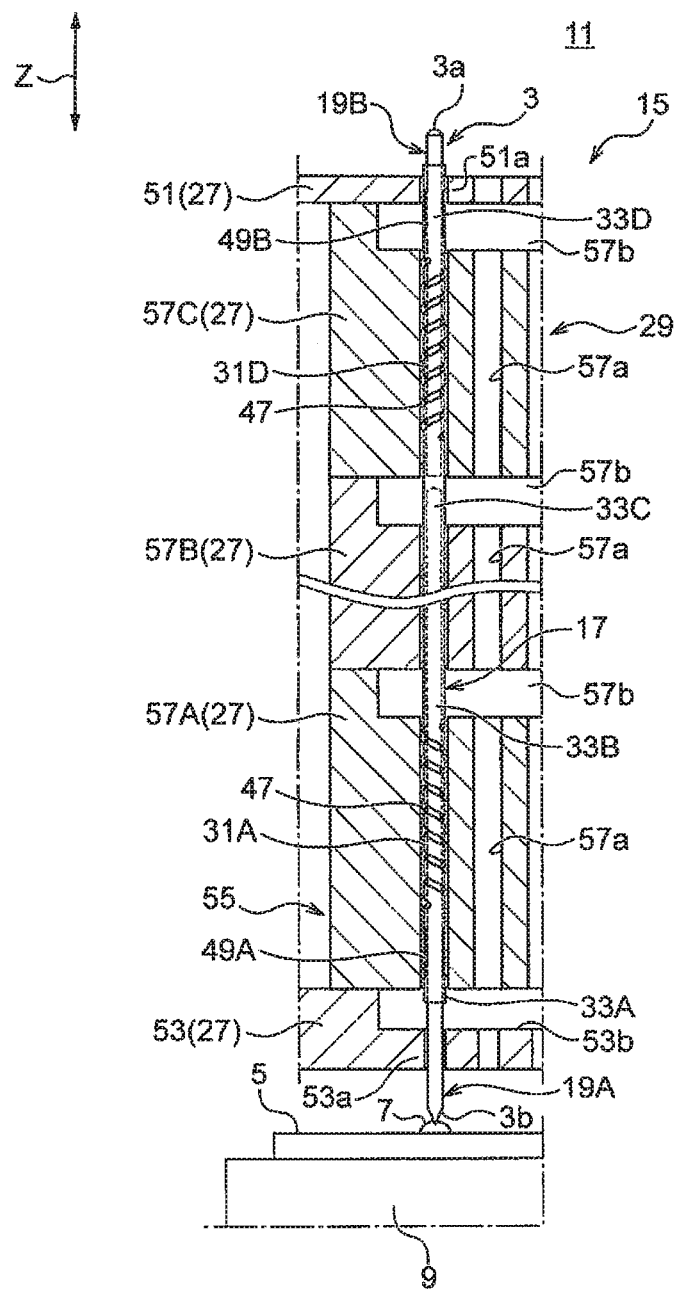
FIG. 8 is a sectional side view in an energization state of the probe card according to the embodiment of the present invention.
Figure 9:
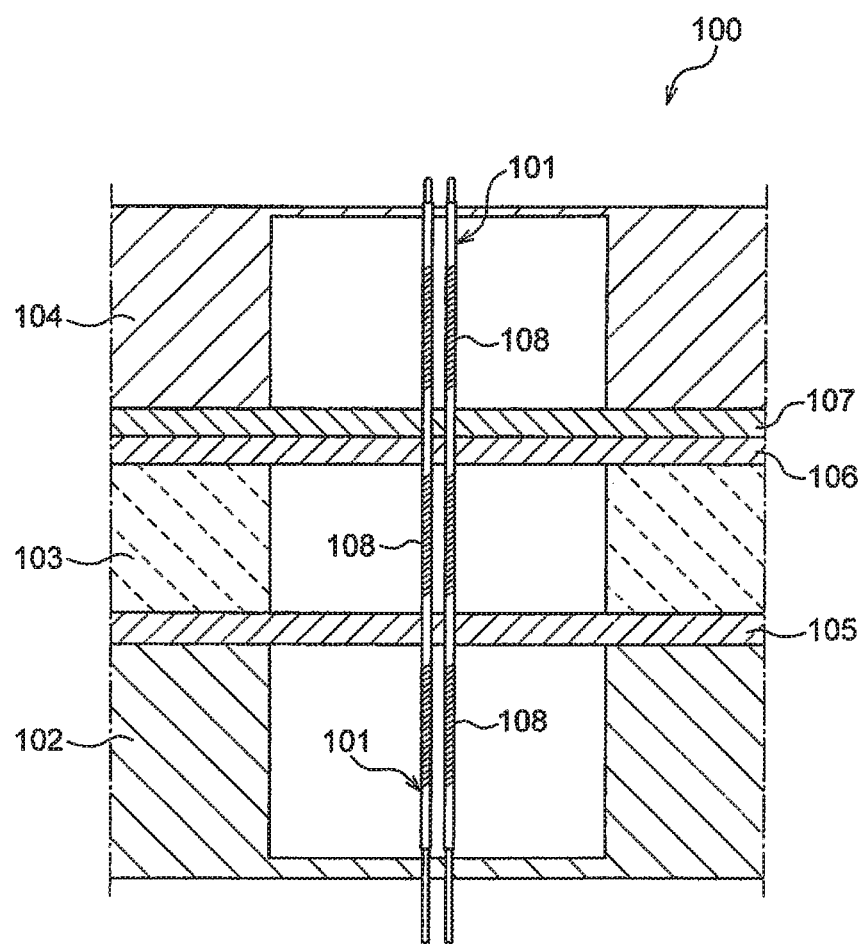
FIG. 9 is a sectional side view schematically illustrating a structure of a conventional probe head.

(3) Content of Energization Inspection Performed with Probe Card (See FIGS. 7 and 8)

Next, a content of an energization inspection performed by using the contact inspection device 1 including the probe card 11 is described with focus on operations during non-energization and energization of the probe 3.

(A) During Non-Energization (See FIG. 7)

The tip portion 3b of the probe 3 during non-energization is located away from the inspected portion 7 of the inspected object 5 mounted on the mounting portion 9. No load is applied to the spring portion 31 in this state, so that the tip of the first plunger 19A of about 1 mm protrudes from the end face on the tip portion 3b side of the tube body 17 as described above.

(B) During Energization (See FIG. 8)

The drive unit 13 is activated from this state, and the tip portion 3*b* of the probe 3 is relatively moved to the inspected portion 7 and contacts the inspected portion 7 to be pressed with predetermined pressing force. Opposing force acts on the tip portion 3*b* of the probe 3 toward the base end portion 3*a* side from the inspected portion 7, and part of the opposing force acts via the portion having the bonding slit 49A serving as a contact point between the first plunger 19A and the tube body 17 so as to push up the guide tube portion 33A toward the base end portion 3*a* side.

Part of the opposing force acts via the portion having the bonding slit 49B being a contact point between the tube body 17 and the second plunger 19B so as to push down the guide tube portion 33D toward the tip portion 3*b* side. A change in positions of the guide tube portion 33A and the guide tube portion 33D is absorbed by compressive deformation of the four spring portions 31A, 31B, 31C, 31D.

A current flowing from the tip portion 3*b* of the probe 3 to the first plunger 19A is transmitted to the guide tube portion 33A, the spring portion 31A, the guide tube portion 33B, the spring portion 31B, the gap G, the spring portion 31C, the guide tube portion 33C, the spring portion 31D, the guide tube portion 33D, and the second plunger 19B in this order and has an electric signal sent to the controller 23 via the MLC 43.

At this time, a temperature of the four spring portions 31A, 31B, 31C, 31D rises due to Joule heat. However, in the present embodiment, the plurality of intermediate guide portions 57A, 57B, 57C are provided in a wide range located opposite to the spring portions 31A, 31B, 31C, 31D, so that a heat radiation action of the intermediate guide portions 57A, 57B, 57C is effectively achieved, thereby suppressing a rise in temperature of the probe 3. In other words, the Joule heat is absorbed by an inner circumferential surface of the intermediate guide hole 57*a* of the intermediate guide portions 57A, 57B, 57C located opposite to the spring portions 31A, 31B, 31C, 31D and is radiated, thereby suppressing a rise in the temperature.

The probe card 11 and the contact inspection device 1 according to the present embodiment formed as described above can suppress a rise in temperature of the spring portion 31 provided in the tube body 17 of the probe 3 even in a case where an energization inspection is performed by applying a high current to perform an energization inspection on the inspected object 5 by using the conductive probe 3 having the spring property. In this way, an energization inspection can be performed without deteriorating the spring property of the probe 3, so that a decrease in inspection accuracy of an energization inspection can be suppressed.

Other Embodiment

The probe card 11 and the contact inspection device 1 according to the present invention basically have the configuration described above, but a partial configuration can be naturally modified or omitted in a range without departing from the purpose of the invention.

For example, the heat radiation structure 29 can be provided in all the guide portions 27 located opposite to the probe 3 and can also be provided in only some of the guide portions 27. The heat radiation structure 29 can be applied to the entire member forming the guide portions 27 and can also be applied to only a range of some of the guide portions 27 located opposite to the spring portion 31.

The three intermediate guide portions 57A, 57B, 57C are used in the embodiment above, but four or more intermediate guide portions 57 can be provided, or two or less intermediate guide portions 57 can be provided.

DESCRIPTION OF REFERENCE NUMERALS

1/contact inspection device
3/probe
3*a*/base end portion
3*b*/tip portion
5/inspected object
7/inspected portion
9/mounting portion
11/probe card
12/card structure
13/drive unit
15/probe head
17/tube body
19/plunger (rod body)
23/controller
25/tester
27/guide portion
29/heat radiation structure
31/spring portion
33/guide tube body
35/clamp head
37/stiffener
39/printed board
41/fix ring
43/MLC
45/fix screw
47/slit
49A, 49B/bonding slit
51/upper guide portion
51*a*/upper guide hole
52/intermediate spacer
53/lower guide portion
53*a*/lower guide hole
53*b*/recessed portion
55/housing recessed portion
57/intermediate guide portion
57*a*/intermediate guide hole
57*b*/recessed portion
Z/axis direction
G/gap
S/space

The invention claimed is:

1. A probe card comprising: a probe having a spring property; and a probe head that holds the probe, wherein
the probe head includes a guide portion that holds the probe within and through a straight hole such that the probe can move in an axial direction,
the guide portion includes a heat radiation structure that absorbs heat of the probe generated by energization and emits the heat to the outside of the probe,
the probe head includes:
an upper guide portion having an upper guide hole for holding an upper portion of the probe,
a lower guide portion having a lower guide hole for holding a lower portion of the probe, and
an intermediate guide portion that is located between the upper guide portion and the lower guide portion and has an intermediate guide hole for holding an intermediate portion of the probe, and
the straight hole comprises the upper guide hole, the lower guide hole and the intermediate guide hole.

2. The probe card according to claim 1, wherein
in the heat radiation structure, at least a part of a portion of the guide portion opposite to the probe is formed of a high heat conductive material that radiates and dissipates heat generated in the probe in a direction away from the probe.

3. The probe card according to claim 1, wherein
at least a part of a heat-absorbing portion of the heat radiation structure is located opposite to a portion in which the spring property of the probe appears.

4. The probe card according to claim 1, wherein the guide portion including the heat radiation structure is the intermediate guide portion.

5. The probe card according to claim 4, wherein
the intermediate guide portion is divided into a plurality of guide portions in a vertical direction.

6. The probe card according to claim 1, wherein
the spring property of the probe is provided by a slit provided in a conductive tube body forming the probe.

7. The probe card according to claim 6, wherein the probe includes:
a tube body including a spring portion in which the spring property appears in a part of a guide tube portion having a sleeve-like shape, and
a rod body that is inserted in the tube body, can be displaced in axial direction together with the tube body by being bonded to a part of the guide tube portion, and has conductivity.

8. A contact inspection device comprising:
a mounting portion on which an inspected object is mounted;
the probe card according to claim 1; and
a drive unit that changes a relative position between an inspected portion of an inspected object on the mounting portion and the probe card such that the inspected portion and the probe card can move close to and away from each other, wherein
the contact inspection device performs an energization inspection on the inspected portion of the inspected object mounted on the mounting portion while the probe contacts the inspected portion.

9. The probe card according to claim 1, wherein
the probe card comprises a plurality of probes, and
the intermediate guide portion has a recessed portion formed on an upper surface thereof that extends all the way from one probe to adjacent another probe.

10. The probe card according to claim 9, wherein
the recessed portion communicates with the intermediate guide hole.

11. The probe card according to claim 1, wherein
the probe card comprises a plurality of probes, and
the lower guide portion has a recessed portion formed on an upper surface thereof that extends all the way from one probe to adjacent another probe.

12. The probe card according to claim 11, wherein
the recessed portion communicates with the lower guide hole.

* * * * *